United States Patent

[11] 3,609,472

[72] Inventor Robert F. Bailey
Los Alamitos, Calif.

[21] Appl. No. 826,543
[22] Filed May 21, 1969
[45] Patented Sept. 28, 1971
[73] Assignee TRW Semiconductors, Inc.
Lawdale, Calif.

[54] HIGH-TEMPERATURE SEMICONDUCTOR AND METHOD OF FABRICATION

13 Claims, 1 Drawing Fig.

[52] U.S. Cl. .......... 317/234 R, 29/589, 117/212, 117/217, 204/192, 317/234 L, 317/234 M
[51] Int. Cl. .......... H01l 3/00
[50] Field of Search .......... 317/234, 235, 235 (5), 235 (5.2), 235 (5.3), 235 (5.4), 235 (22); 29/588, 589, 590, 194

[56] References Cited

UNITED STATES PATENTS

| | | | |
|---|---|---|---|
| 3,274,670 | 9/1966 | Lepselter .......... | 317/234 X |
| 3,399,331 | 8/1968 | Mutter et al. .......... | 317/234 |

*Primary Examiner*—John W. Huckert
*Assistant Examiner*—William D. Larkin
*Attorney*—Spensley & Horn

ABSTRACT: A contact for a semiconductor device capable of withstanding environments comprising high-temperature treatment, chemical attack by silicon etchants, and high oxidation ambients, and a method of fabricating said contact. A bimetallic layer comprising an alloy of platinum and nickel is disposed upon the active regions of a semiconductor device, the metal layer being in electrical contact with the semiconductor device. A layer of platinum is provided atop the platinum-nickel layer and this in turn is protected by a covering layer of rhodium. A layer of gold is then placed upon the rhodium for external connection.

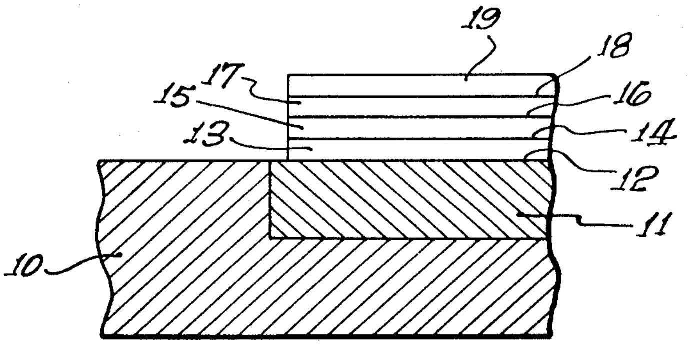
INVENTOR.
ROBERT F. BAILEY,
BY HIS ATTORNEYS
Spensley & Horn

HIGH-TEMPERATURE SEMICONDUCTOR AND METHOD OF FABRICATION

BACKGROUND OF THE INVENTION

1. Field of the Invention

The present invention contact structure and method of fabrication relates generally to the field of electrical contacts for semiconductor devices, but more specifically to that class of contacts which will withstand highly corrosive and deleterious environmental conditions.

2. Prior Art

The electrical contacts for semiconductor devices, as disclosed by the prior art, are not adequate to provide reliable electrical contacts for devices intended to be subjected to potentially damaging environments during the manufacturing process. The present invention solves the reliability problems, providing a device the reliability of which is superior to that disclosed by prior art.

The environments which are in point are high-temperature treatment, chemical attack by chemical etchants and high-oxidation ambients. The damaging ambient conditions cause failures as a result of chemical and mechanical breakdown of the contact bonds. The conditions arise from the specialized processing techniques used in device fabrication. High-temperature treatment, which gives rise to thermal stress, shall hereinafter be understood to mean temperatures in a range of 600°–900° C., the high-temperature treatment used in the removal of water films as well as the formation of passivating layers on the surface of the semiconductor device. High-oxidation ambients shall hereinafter be understood to mean an environment represented by high pressure and temperature, e.g., 100 atmospheres of oxygen and 650° C.

A conventional contact for semiconductor devices disclosed by the prior art utilizes an electroless nickel plating. The active region of the semiconductor device is treated in an electroless nickel plating solution to provide a thin film of nickel on the active region of the semiconductor device. The process requires that the device be immersed in an aqueous solution containing typically, nickelous chloride, the bath being kept at a precise pH level and at a constant temperature. The device is then removed from the bath and sintered to diffuse some of the nickel into the active regions of the semiconductor device and to provide an adherent bond between the device and the nickel. One of the problems inherent in this technique is the inability to reliably reproduce the sporadically produced good bond with any degree of high probability. The inability to reliably reproduce good adhesive contacts is based on the inability to consistently control the variables of the process. Any variation in the process steps will affect the resulting contact bond. In addition, the use of a pure nickel contact limits the resistivity of any material to which a contact bond can be made as nickel can form a reliable ohmic contact only to low resistivity N-type or P-type materials. The present invention contact structure and method of fabrication solves this problem by using an alloy of platinum and nickel, the use of the alloy giving a contact which performs better than either contact component used individually. Another problem left unresolved by the prior art is the presence of dopants in the electroless nickel plating solution. A typical solution contains sodium hypophosphite. Phosphorous is a silicon dopant of N-type conductivity which will be deposited along with the nickel thereby adversely affecting the electronic structure of the interface region.

Another contact disclosed by the prior art is the deposition of platinum on the semiconductor surface. To fabricate an effective electrical contact, the contact must be ohmic as contrasted to rectifying. Platinum is not a good ohmic contact to N-type material. When pure platinum is deposited on silicon, compounds such as platinum silicide form at the interface. When the compound is subjected to thermal stress, the shearing forces created can cause separation of the contact from the surface of the semiconductor device. The present invention contact structure and method of fabrication solve this problem by utilization of an alloy which prevents the creation of the platinum-silicon compounds in quantities large enough to cause the contact and the silicon chip to separate from one another.

The prior art also discloses the use of an aluminum base alloy as a contact member. The use of an aluminum base alloy as a contact material is adequate only where the operating environment is not severe and will not attack the bond at the interface. Where the device is to be used under an environment comprising high temperature, chemical attack by silicon etchants, or high oxidation ambients, the contact disclosed by the prior art fails to resolve the problems in that the bond will be destroyed. The alloy employed by the present invention contact structure together with additional metal layers solves this problem by withstanding the effects of the deleterious environment,

SUMMARY OF THE INVENTION

It is an object of the present invention to provide a contact structure for a semiconductor device that will withstand the effects of any of the following: high-thermal stress, attack from chemical etchants, and high oxidation ambients.

It is another object of the present invention to provide a contact structure which will form reliable bonds to the high resistivity P-type and N-type material.

It is yet another object of the present invention to provide an improved ohmic contact.

It is still yet another object of the present invention to provide an adhesive bimetallic contact, the quality of which can be reliably reproduced.

To form a reliable adhesive bond between an electrical contact and the surface of a semiconductor device, the present invention contact structure and method of fabrication utilizes the properties of an alloy in platinum and nickel. When the contact surface of the semiconductor device is a silicon substrate, a layer of the platinum-nickel alloy is sputtered upon the active regions of the semiconductor device after which the device is sintered, preferably at a temperature of approximately 750° C. for approximately 5 minutes.

Sintering will cause diffusion of the alloy into the silicon surface which will create a better bond than either platinum or nickel could produce individually. The improvement of the bond between the alloy of platinum and nickel (as contrasted with that of either element used alone) and the silicon surface is due to the prevention of extensive formations of complex platinum-silicon compounds, (in the case of pure platinum). Another improvement inherent in the present invention is the improved process control over that used in the electroless plating of pure nickel.

The interface formed by the alloy and the silicon surface will withstand the chemical and mechanical failures prevalent in the contacts made in accordance with the techniques disclosed by the prior art. Best results occur when the alloy is comprised of 30 to 40 percent (atomic percent) of platinum with the remainder being nickel.

In order to protect the metal layer of the platinum-nickel alloy, and to try to provide a contact metal for connection to external leads, three sequential layers of metal are preferably deposited. The layer of platinum is disposed upon the platinum-nickel layer. The platinum serves as a stress relief member between the platinum-nickel layer and the next sequential layer or rhodium. The platinum is a flexible, deformable, and chemically inert material. A layer of rhodium is then deposited upon the platinum layer. The layer of rhodium acts as a barrier to the top layer of contact metal, typically gold, and prevents the gold from reacting with the silicon.

The novel features which are believed to be characteristic of the invention, both as to its organization and method of operation will be better understood from the following description considered in connection with the accompanying drawing in which a presently preferred embodiment of the invention is illustrated by way of example. It is to be understood that the drawing is for the purpose of illustration and description only, and not intended as a definition of the limits of the invention.

BRIEF DESCRIPTION OF THE DRAWING

In the drawing:

The drawing illustrates a sectional view of a semiconductor contact made in accordance with the present invention.

DESCRIPTION OF THE PRESENTLY PREFERRED EMBODIMENTS

In a presently preferred embodiment of the present invention, an electrical connection is made between a contact structure and a semiconductor device. The semiconductor device is typically a silicon wafer 10 of a predetermined conductivity into the surface of which is diffused one or more active regions 11 of the opposite conductivity to produce one or more PN-junctions. The semiconductor device is described here for the purpose of example only and the manner of fabrication of the semiconductor device is in no way a part of the present invention. It will also be obvious to one with ordinary skill in the art that the present invention contact structure and method of fabrication is applicable to any semiconductor device irrespective of the number of active regions, e.g., a transistor, a diode, etc.

The first layer of the present invention contact structure is a layer 13 of a metal alloy of platinum and nickel. In order to fully describe the improvement caused by the utilization of the platinum-nickel alloy layer 13, a discussion of the older techniques is called for. A metal commonly used for contacting a silicon substrate, as disclosed by the prior art, is nickel. To implement a nickel layer, the silicon wafer is treated in an electroless nickel-plating solution to provide a thin film of nickel on the appropriate surface of the silicon wafer, the nickel making contact with the appropriate active region on the silicon wafer. This is carried out by immersing the silicon wafer in a bath of solution typically comprising ammonium chloride, nickelous chloride, sodium hypophosphite, and citric acid. The bath must be adjusted to the proper pH level and maintained at the proper temperature. When the silicon wafer is removed, it is generally dried and heated to a temperature of 700°–800° C. to diffuse some of the nickel into the silicon. The electroless plating of nickel creates a lamination which adheres to the silicon, the quality of which ranges from very poor to good.

The problem inherent in the prior art lies in the wet process steps of electroless plating the exactness of which is difficult to reproduce. The solution shown contains phosphorous which is an N-type dopant, therefore the impurity can be deposited along with the nickel film thereby affecting the electronic structure of the interface.

The layer 13 of the platinum-nickel alloy can be disposed upon the surface 12 of the active region 11 of the silicon wafer 10 by conventional methods, but a substantially stronger bond is achieved when the process of sputtering is utilized. Sputtering is the ejection of atoms from a surface that has been subjected to bombardment from a source of ionized particles. The source atoms will acquire sufficient energy to escape from their surface by the transfer of momentum from the bombarding ions to the source atoms. The deposition energy of the atoms arriving at the surface of the silicon wafer is nominally 10–15 electron volts. This energy is sufficient to dislodge unwanted surface materials and breakdown compounds on the surface. In contrast to sputtering, a typical vacuum evaporation process is a deposition of a material from a vapor source at a reduced pressure. When a vacuum evaporation process is used, the energy of the atoms arriving at the surface of the silicon wafer would not exceed a deposition energy of 0.5 electron volts.

The alloy of platinum and nickel is a better contact material than pure nickel because of the broader range of wafer materials and dopants that can be used. A nickel contact is generally a good ohmic contact to low resistivity P-type or N-type material, but it is a poor ohmic contact to high resistivity materials. The platinum-nickel alloy is a good ohmic contact even to high resistivity P-type and N-type materials.

The prior art also discloses the use of platinum to make an electrical contact with a silicon wafer. When platinum is deposited or otherwise disposed upon a silicon wafer, there is a likelihood of detrimental complex compounds developing at the interface of the platinum and silicon. Such compounds, typically platinum-silicide, have crystal lattices incompatible with contiguous lattices which will result in shearing forces. The shearing forces can cause failure of the device by destruction of the contact bond. When platinum-silicide develops across a broad section of the interface, the coefficient of thermal expansion of the contiguous material will not provide a stable mechanical interface. The contact may break off when the device is subjected to high temperature and the resultant thermal stress. When nickel is added to platinum thereby forming an alloy, the combination prevents the formation of large portions of the platinum-silicide. As the portion of nickel added to the alloy is increased, the formation of the platinum-silicide becomes more and more localized. It has been found that a percentage of platinum, of 30–40 atomic percent and therefore an atomic percentage of nickel of 70 to 60 percent respectively, forms a highly reliable contact which will not break off from the silicon wafer 10 when the semiconductor device is subjected to high temperature and the resultant thermal stress, and/or high oxidation ambients.

The basic contact component of the present invention contact structure is the platinum-nickel alloy layer 13. The bond created between the alloy layer 13 and the surface 12 of the active region 11 must be protected. As will be discussed, a metal layer 17 of rhodium is an element of the present invention contact structure. Because of the stress characteristics of the rhodium layer 17, a stress relief member is provided to protect the interface between the platinum-nickel layer 13 and the active region 11. The stress relief member is a metal layer 15 of platinum, the platinum layer 15 being disposed upon the platinum-nickel layer 13 at the surface 14. The platinum layer 15 is a stress relief member which buffers the platinum-nickel alloy layer 13 from the subsequent rhodium layer 17. The platinum is ductile, easily deformable, and chemically inert. The stress created by rhodium layer 17 will not be transferred to the platinum-nickel layer 13. The platinum can be disposed upon the surface of the platinum-nickel alloy 13 in any conventional manner, but the preferable method is by sputtering.

As mentioned above a layer 17 of rhodium is disposed upon the surface 16 of the platinum layer 15, the rhodium acting as a barrier to the subsequent layer of contact metal. The rhodium is a dense metal that plates into a stressed film. The production of the stressed film of rhodium necessitates the inclusion of the platinum layer 15 as a differential stress relief member. The rhodium can be disposed upon the platinum layer 15 by any conventional technique, but is preferably disposed by electroplating. The rhodium plating is carried out in a standard rhodium plating bath.

The outer layer 19 of the present invention contact structure can be any conventional contact metal which is appropriate for connection to external leads and devices, but it is preferably gold. The gold layer 19 is disposed upon the rhodium layer 17 at surface 18, and it can be disposed upon the rhodium layer 17 by any conventional technique, but is preferably deposited by electroplating. The gold layer 19 provides a nonoxidizing surface which readily permits thermal compression, bonding, soldering, or eutectic bonding. In addition, the gold is chemically inert to normal etchants used in the manufacture of silicon semiconductor devices.

A contact structure fabricated in accordance with the present invention method will be an improved ohmic contact. The depth of the metal layers of the present invention contact structure can be varied, but the following represents a typical contact structure fabricated in accordance with a typical embodiment of the present invention method. The platinum-nickel layer 13 is sputtered upon the surface 12 of the semiconductor device, the depth of the layer being within the range of 2,500–8,000 angstroms. The platinum layer 15 is sputtered upon the surface 14 of the platinum-nickel alloy layer 13, the depth of the layer being within the range of 2,500 to 8,000 angstroms. The rhodium layer 17 is disposed upon the surface 16 of the platinum layer 15, typically by an electroplating process, the depth of the plated layer 17 being within the range of 8,000–10,000 angstroms. The gold layer 19 is disposed upon the surface 18 of the rhodium layer 17, typically by an electroplating process, the depth of the gold layer 19 being within the range of 2–5 microns. After each of the preceding deposition steps of the present invention method, the silicon wafer 10 is sintered in accordance with conventional techniques.

Alternative embodiments of the present invention method are a result of modifying the steps wherein the specific metal layers are disposed upon the silicon wafer 10. For example, the platinum-nickel alloy layer 13 can be disposed upon the surface 12 by sputtering a layer one-half the final depth, (e.g., 4,000 angstroms), sintering, sputtering a second alloy layer 4,000 angstroms and sintering a second time.

I claim:

1. A combination of a semiconductor device and a high-temperature contact therefor, said combination comprising:
- a. a semiconductor device having a predetermined region to which electrical contact is to be made;
- b. a bimetallic alloy layer of platinum and nickel for making electrical contact, disposed upon said predetermined region of said semiconductor device; and
- c. a metal layer connected to said bimetallic layer.

2. A combination of a semiconductor device and a high-temperature contact therefor as in claim 1 wherein said metal layer is comprised of sequential strata of platinum, rhodium and gold.

3. A combination of a semiconductor device and high-temperature contacts therefor, said combination comprising:
- a. a semiconductor device having a top, bottom, and side surfaces, said semiconductor device having active regions being disposed upon respective surfaces thereof;
- b. a layer of a metal alloy of platinum and nickel being disposed upon each of said active regions of said semiconductor device;
- c. a metal layer of platinum being disposed upon each of said layers of metal alloy of platinum and nickel;
- d. a metal layer of rhodium being disposed upon each of said metal layers of platinum; and
- e. a layer of contact metal being disposed upon each of said metal layers of rhodium.

4. A combination of a semiconductor device and high-temperature contacts therefor as in claim 3 wherein said metal alloy is comprised of 30–40 percent platinum by volume.

5. A combination of a semiconductor device and high-temperature contacts therefor as in claim 3 wherein said metal alloy of platinum and nickel is disposed upon said active regions of said semiconductor device by sputtering.

6. A combination of a semiconductor device and high-temperature contacts therefor as in claim 3 wherein said contact metal is gold.

7. A method for fabricating a contact on a semiconductor device comprising the steps of:
- a. providing a semiconductor device having a portion thereof adapted for making electrical contact thereto;
- b. disposing a bimetallic layer upon said portion of said semiconductor device;
- c. establishing upon said bimetallic layer a first metal layer comprising one of the components of said bimetallic layer;
- d. disposing a second metal layer of rhodium upon said first metal layer; and
- e. disposing a third metal layer of gold upon said second metal layer.

8. A method as in claim 7 wherein said bimetallic layer is an alloy of platinum and nickel.

9. A method as in claim 7 wherein said bimetallic layer is disposed upon said portion of said semiconductor device by sputtering.

10. A method for fabricating a contact structure on a semiconductor device, comprising the steps of:
- a. providing a semiconductor device having a top, bottom, and side surfaces, said semiconductor device having active regions being disposed upon respective surfaces thereof;
- b. disposing upon said active regions a first metal layer comprising an alloy of platinum and nickel;
- c. establishing upon said first metal layer a second metal layer of platinum;
- d. disposing upon said second metal layer a third metal layer of rhodium; and
- e. disposing upon said third metal layer a fourth metal layer of gold.

11. A method as in claim 15 wherein said metal alloy of platinum and nickel is 30–40 percent by atomic percent.

12. A method as in claim 15 wherein said first metal layer is disposed upon said active regions of said semiconductor device by sputtering.

13. A combination of a semiconductor device and a high-temperature contact therefor, said combination comprising:
- a. a semiconductor having a portion of a surface thereof adapted for making electrical contact thereto;
- b. a bimetallic alloy layer of platinum and nickel disposed upon said portion of said surface of said semiconductor device;
- c. a metal layer disposed upon said bimetallic alloy layer, said metal layer having one of the components of said bimetallic alloy layer; and
- d. protective metal means disposed upon said metal layer.